United States Patent [19]

Ohno et al.

[11] Patent Number: 5,702,862
[45] Date of Patent: Dec. 30, 1997

[54] POSITIVE PHOTORESIST COATING SOLUTION COMPRISING A MIXED SOLVENT OF PROPYLENE GLYCOL MONOPROPYL ETHER AND 2-HEPTANONE

[75] Inventors: Hayato Ohno; Taku Nakao; Hisanobu Harada; Shinichi Hidesaka; Hidekatsu Kohara; Toshimasa Nakayama, all of Kanagawa, Japan

[73] Assignee: Tokyo Ohka Kogyo Co., LTD., Kanagawa, Japan

[21] Appl. No.: 797,663

[22] Filed: Jan. 31, 1997

[30] Foreign Application Priority Data

Feb. 2, 1996 [JP] Japan ................. 8-040461

[51] Int. Cl.$^6$ ............................................. G03F 7/023
[52] U.S. Cl. ...................... 430/191; 430/192; 430/193
[58] Field of Search ........................... 430/191, 192, 430/193

[56] References Cited

U.S. PATENT DOCUMENTS

| | | | |
|---|---|---|---|
| 5,279,922 | 1/1994 | Adachi et al. | 430/270.1 |
| 5,336,583 | 8/1994 | Uetani et al. | 430/191 |
| 5,437,952 | 8/1995 | Hirai et al. | 430/191 |
| 5,514,515 | 5/1996 | Zampini et al. | 430/192 |
| 5,604,077 | 2/1997 | Kono et al. | 430/192 |
| 5,612,164 | 3/1997 | Canize et al. | 430/191 |

FOREIGN PATENT DOCUMENTS

| | | |
|---|---|---|
| 0 510 671 | 10/1992 | European Pat. Off. . |
| 4-9063 | 1/1992 | Japan . |
| 9063 | 1/1992 | Japan . |
| 4-362645 | 12/1992 | Japan . |
| 7-84360 | 3/1995 | Japan . |

*Primary Examiner*—John S. Chu
*Attorney, Agent, or Firm*—Sughrue, Mion, Zinn, Macpeak & Seas, PLLC

[57] ABSTRACT

A positive photoresist coating solution comprising (a) an alkali-soluble resin, (b) a quinone diazide group-containing compound, and (c) an organic solvent in an amount sufficient for dissolving said (a) and (b) components, wherein said organic solvent contains (i) propylene glycol monopropyl ether and (ii) 2-heptanone. The solution of the present invention exhibits excellent coating ability, sensitivity, thermostability, focal depth range, shape-profiling ability, and the like.

9 Claims, No Drawings

POSITIVE PHOTORESIST COATING SOLUTION COMPRISING A MIXED SOLVENT OF PROPYLENE GLYCOL MONOPROPYL ETHER AND 2-HEPTANONE

BACKGROUND OF THE INVENTION

1. Field of the Invention

The present invention relates to a positive photoresist coating solution, and more specifically, relates to a positive photoresist coating solution which exhibits excellent coating ability, sensitivity, thermostability, focal depth range and shape-profiling ability, and which generates no developer residue while exhibiting a high film fixation ratio.

2. Description of the Related Art

Hitherto, in production of electronic parts such as semiconductor devices and liquid crystal devices, pattern transcription by photolithography is employed as a method for forming patterns on substrates. In photolithography, a resist is applied to a substrate such as a silicon wafer and a glass plate using a spinner, is dried and then irradiated with an active beam through a mask to complete development, and whereby, a mask pattern is transcribed on the substrate, and further, etching is carried out.

In the above-mentioned photolithography, positive photoresists and negative photoresists can be used as the resist. Since negative photoresists have limited resolution due to swelling during development, positive photoresists, which have excellent definition, are used at present. As such a positive photoresist, a resist composition containing an alkali-soluble resin and a photosensitive material being a quinone diazide group-containing compound is generally used. As a solvent for such a resist composition, a Cellosolve-type solvent was used, which has excellent solvency for quinone diazide group-containing compounds. Cellosolve-type solvents, however, have drawbacks in view of human safety and hygiene, and therefore, substitutions such as propylene glycol monomethyl ether acetate were proposed.

Meanwhile, in recent years, the size of substrates such as silicon wafers have been grown to 8 inches in diameter from 6 inches, and further, they are anticipated to reach 12 inches in the near future. When such a substrate having an enlarged diameter is subjected to application using a simple solvent such as the above-mentioned propylene glycol monomethyl ether acetate, the resulting film is irregular and inferior in adherence and long term stability. To solve such problems, Japanese Patent Laid-Open Nos. 4-362645, 5-34918, 5-34919, 7-84360, and others offered mixed solvents comprising 2-heptanone and another solvent such as γ-butyrolactone, ethyl lactate, 3-methoxybutanol, cyclohexanone, butyl acetate, and propylene glycol monomethyl ether acetate. Such mixed solvents, however, have drawbacks though they have excellent coating ability, sensitivity, thermostability, focal depth range and shape-profiling ability. For example, during developing treatment, the concentration of a photosensitive material increases due to the high vapor pressure of 2-heptanone, and as a result, the photosensitive material remains as developer residue and the ratio of the fixed coating material (film fixation ratio) is low.

SUMMARY OF THE INVENTION

Under such circumstances, the Inventors earnestly conducted several investigations in order to develop a solvent which does not cause developer residue but actualizes a high film fixation ratio while having the above-described desirable characteristics, and as a result, reached the following finding: A positive photoresist coating solution which exhibits excellent coating ability, sensitivity, thermostability, focal depth range and shape-profiling ability without causing developer residue but has a high film fixation ratio even in a large diameter substrate can be obtained by using a mixed solvent comprising propylene glycol monopropyl ether and 2-heptanone as a solvent for a positive photoresist.

The present invention has been accomplished based on the above finding, and the object of the present invention is to provide a positive photoresist coating solution which exhibits excellent coating ability, sensitivity, thermostability, focal depth range and shape-profiling ability, and which does not generate developer residue while exhibiting a high film fixation ratio.

Specifically, the present invention relates to a positive photoresist coating solution comprising (a) an alkali-soluble resin, (b) a quinone diazide group-containing compound, and (c) an organic solvent, wherein said organic solvent contains (i) propylene glycol monopropyl ether and (ii) 2-heptanone.

DETAILED DESCRIPTION OF THE INVENTION

The alkali-soluble resin (a) to be used for the positive photoresist coating solution of the present invention may include a condensation product of a phenol compound and an aldehyde compound, or of a phenol compound and a ketone compound; and polyhydroxystyrene, and derivatives thereof.

Examples of the above-mentioned phenol compound may include cresol compounds such as phenol, m-cresol, p-cresol, and o-cresol; xylenol compounds such as 2,3-xylenol, 2,5-xylenol, 3,5-xylenol, and 3,4-xylenol; alkylphenol compounds such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, and 2-tert-butyl-5-methylphenol; alkoxyphenol compounds such as p-methoxyphenol, m-methoxyphenol, p-ethoxyphenol, m-ethoxyphenol, p-propoxyphenol, and m-propoxyphenol; isopropenylphenol compounds such as o-isopropenylphenol, p-isopropenylphenol, 2-methyl-4-isopropenylphenol, and 2-ethyl-4-isopropenylphenol; and polyhydroxyphenol compounds such as dihydroxybiphenyl, bisphenol A, 2-phenylphenol, resorcinol, hydroquinone, and pyrogallol. Each of these phenol compounds may be used solely or in combination with one or more of them. Among them, m-cresol, p-cresol, 2,5-xylenol, 3,5-xylenol, and 2,3,5-trimethylphenol are preferred.

As to the above-mentioned aldehyde compound, examples may include formaldehyde, paraformaldehyde, trioxan, acetaldehyde, propionaldehyde, butylaldehyde, trimethylacetaldehyde, acrolein, crotonaldehyde, cyclohexanealdehyde, furrural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, o-tolualdehyde, m-tolualdehyde, p-tolualdehyde, and cinnamic aldehyde. Each of these aldehyde compounds may be used solely or in combination with one or more of them. Among the above-listed aldehyde compounds, formaldehyde is preferred since it is easily available. To obtain a resin having particularly excellent thermostability, formaldehyde is preferably used in combination with a hydroxybenzaldehyde compound.

Further, examples of the above-mentioned ketone compounds may include acetone, methyl ethyl ketone, diethyl ketone, and diphenyl ketone. Each of these ketone compounds may be used solely or in combination with the others. As the alkali-soluble resin comprising the above-described phenol compound and ketone compound, a pyrogallol-acetone resin is preferred, which is a condensation product of pyrogallol and acetone.

Condensation of the above-listed phenol compound with the above-listed aldehyde compound or ketone compound may be carried out in the presence of an acidic catalyst according to a publicly-known method. Hydrochloric acid, sulfuric acid, formic acid, acetic acid, oxalic acid, paratoluenesulfonic acid, or the like can be used as the acidic catalyst. Although a condensation product thus obtained may be used as obtained, further subjection of the product to treatment for cutting off the low molecular weight components (fractionation) is preferred since excellent thermostability can be achieved. Various methods can be employed for such a treatment. For example, a resin obtained through a condensation reaction, i.e. a condensation product, is dissolved in good solvent such as an alcohol solvent such as methanol and ethanol; a ketone solvent such as methyl ethyl ketone; ethylene glycol monoethyl ether acetate; or tetrahydrofuran, and subsequently, precipitation is performed by pouring the above-obtained solution into water. A preferred weight average molecular weight of the condensation product after cutting off the low molecular weight components is within a range of 2000 to 25000, and more preferably, 2500 to 20000 in terms of polystyrene by gel permeation chromatography.

As to the above-mentioned polyhydroxystyrene and derivatives thereof, examples may include homopolymers of vinylphenol, and copolymers of vinylphenol and a comonomer. Examples of the comonomer may include acrylic acid derivatives; acrylonitrile; methacrylic acid derivatives; methacrylonitrile; styrene; and styrene derivatives such as α-methylstyrene, p-methylstyrene, o-methylstyrene, p-methoxystyrene, and p-chlorostyrene.

Of these alkali-soluble resin (a), cresol-novolak resins obtained by condensation of at least one kind selected from m-cresol, p-cresol, 2,5-xylenol, 3,5-xylenol and 2,3,5-trimethylphenol with formaldehyde in the presence of an acid catalyst are preferable in practical use.

The quinone diazide group-containing compound (b) to be used in the present invention may preferably be a completely or partially esterified compound of a polyhydroxy compound and an acid such as naphthoquinone-1,2-diazide-5-sulfonic acid, naphthoquinone-1,2-diazide-4-sulfonic acid. Further, as the acid component, orthobenzoquinonediazidesulfonic acid and orthoanthraquinonediazidesulfonic acid may also be used. Furthermore, it is preferable to adopt the polyhydroxy compound having a molecular weight of 600 or less. Examples of the polyhydroxy compound may include hydroxybenzophenone compounds such as 2,3,4-trihydroxybenzophenone, and 2,3,4,4'-tetrahydroxybenzophenone; hydroxyaryl compounds such as 1-[1-(4-hydroxyphenyl)isopropyl]-4-[1,1-bis(4-hydroxyphenyl)ethyl]benzene, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3,4-dihydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, and bis(2,3,4-trihydroxyphenyl)methane.

The above-mentioned ingredient (b) can be produced by esterifying a polyhydroxy compound with naphthoquinone-1,2-diazide-5-sulfonyl chloride or naphthoquinone-1,2-diazide-4-sulfonyl chloride, wherein the mole number of the latter is 50% or more, and preferably, 60% or more of the number of the hydroxyl groups in the polyhydroxy compound. The average degree of esterification in the above esterifying reaction is preferably 50% or more, and more preferably, 60% or more. A reaction product having such a degree of esterification is suitable since a positive photoresist coating solution prepared with such a reaction product exhibits high sensitivity and high resolution.

The content of the ingredient (b) in the coating solution of the present invention is set at 5 to 100% by weight, and preferably, 10 to 50% by weight relative to the amount of the ingredient (a), i.e. an alkali-soluble resin. Where the below-described phenol compound is used, the content ratio of the ingredient (b) may be considered relative to the total amount of the above (a) and the phenol compound. With the content of the ingredient (b) below 5% by weight, an image faithfully following a pattern cannot be obtained and the degree of transcription is low. On the other hand, with the content exceeding 100% by weight, the regularity of the resist film to be formed becomes poor, and definition becomes low.

As occasion demands, in addition to the above-described ingredients (a) and (b), the positive photoresist coating solution of the present invention may contain a publicly-known phenol compound having a low molecular weight to improve sensitivity and definition. Here, the term "low molecular weight" means a molecular weight of 600 or less. Examples of such a low molecular phenol compound may include tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(3-cyclohexyl-4-hydroxy-6-methylphenyl)-4-hydroxyphenylmethane, bis(3-cyclohexyl- 4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, 2-(2,3,4-trihydroxyphenyl)-2-(2',3',4'-trihydroxyphenyl)propane, and bis(2,3,4-trihydroxyphenyl)methane, and further, 2,6-bis[1-(2,4-dihydroxyphenyl)isopropyl]-4-methylphenol, 2,6-bis(2,3,4-trihydroxyphenylmethyl)-4-methylphenol, and 4,6-bis[1-(4-hydroxyphenyl)isopropyl-resorcin.

The amount of the above low molecular phenol compound is set at 5 to 50% by weight, and preferably, 10 to 35% by weight relative to the alkali-soluble resin.

In addition to the above-described ingredients, the positive photoresist coating solution of the present invention may further contain one or more additives within content ranges causing no interference with the object of the present invention. Such additives are, for example, additives miscible with the alkali-soluble resin and others; ultraviolet absorbents for preventing halation such as 2,2',4,4'- tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, and curcumin; surfactants for preventing striation, e.g. fluorine-based surfactants such as Florade FC-430 and FC-431 (manufactured by Sumitomo 3M Ltd.), FTOP EF122A, EF122B, EF122C and EF126 (manufactured by Tochem Products Corporation).

The coating solution of the present invention can be manufactured by dissolving the above ingredients (a) and (b) and the above optional ingredient in a mixed solvent of (i) propylene glycol monopropyl ether and (if) 2-heptanone. By using such a mixed solvent, the positive photoresist coating solution of the present invention is endowed with characteristics such as non-generating developer residue, exhibiting a high film fixation ratio, and in addition, exhibiting excellent coating ability, sensitivity, thermostability, focal depth range, and shape-profiling ability.

The mixing ratio in the above mixed solvent is 10 to 60% by weight of the ingredient (i) and 40 to 90% by weight of the ingredient (if), and preferably, 20 to 50% by weight of the ingredient (i) and 50 to 80% by weight of the ingredient (ii). With an excessive amount of the ingredient (i), degree of development, sensitivity, and resolution will be inferior, and further, shape-profiling ability will also be low. On the other hand, with an excessive amount of the ingredient (ii), long term stability will be inferior, and the film fixation ratio and shape-profiling ability will be low since the solubility of a photosensitive material, especially a benzophenone-type photosensitive material, becomes low.

The solvent mixture should be used in an amount sufficient for dissolving the above (a) and (b) components.

The coating solution of the present invention can suitably be used for a resist pattern formation as a conventional photoresist technique. An example of such a use is illustrated as follows. Initially, the coating solution of the present invention is applied to a substrate such as a silicon wafer or a glass plate using a spinner or a coater to form a photosensitive layer. Secondly, the resultant is subjected to exposure through a mask pattern, which may be performed by irradiation using a light source unit for ultraviolet rays, by irradiation using a reducing projection aligner, by irradiation with an excimer laser beam or an X-ray, or by scanning irradiation with an electron beam. Subsequently, the portions which are made to be soluble by exposure are selectively dissolved and removed by dipping in a developing solution, for example, an aqueous alkaline solution such as containing 1 to 10% by weight of tetramethylammonium hydroxide, thus forming an image faithful to the mask pattern.

The above-illustrated pattern formation can be applied not only to producing semiconductor devices but also to other various fields which have processes employing lithography, such as LCD, TAB, PCB, chemical mealing, and printing, while achieving similar advantages. In particular, the positive photoresist coating solution of the present invention is advantageous for coating large silicon wafers or glass substrates, which cannot be satisfactorily coated with coating solutions using conventional organic solvents.

EXAMPLES

The present invention is further illustrated in detail with examples below.

Incidentally, each of the positive photoresist coating solutions in examples and comparative examples below was evaluated as follows.

(1) Coating Ability

Each sample was applied to a 6 inches silicon wafer in a thickness of 1.3 µm. The samples which had formed a film having a regular thickness were evaluated as "good", and the samples which had formed a film having irregularity in thickness were evaluated as "bad".

(2) Sensitivity

Each sample was applied to a silicon wafer using a spinner, and dried on a hot plate at 90° C. for 90 sec. to obtain a resist film having a thickness of 1.05 µm. The resist film thus obtained was then subjected to exposures with time periods from 0.1 sec. to 0.01 sec. using a reducing projection aligner NSR-2005i10D (manufactured by Nikon Corporation, NA=0.57). Subsequently, the resultant was developed in an aqueous solution containing 2.38% by weight of tetramethylammonium hydroxide at 23° C. for 60 sec., and dried after washing with water for 30 sec. The time period (ms) with which the thickness of the portion exposed becomes zero after the development is regarded as the index of sensitivity.

(3) Thermostability

A resist pattern of 5 µm in width was formed with each sample, and heated on a hot plate. The maximum temperature with which the resist pattern does not cause flowing was regarded as the index of thermostability.

(4) Focal Depth Range

On each sample, resist patterns were formed by performing exposure with different focal points, and by proper development, wherein a reducing projection aligner NSR-2005i10D (manufactured by Nikon Corporation, NA=0.57) was used, and exposure was performed with a standard exposure value of Eop (the exposure value required for achieving a line-and-space replication with the width ratio of 1:1 from a mask pattern of 0.6 µm in width). The resist patterns thus obtained were then observed with SEM (Scanning Electron Microscope) photographs. Based on the SEM photographs, the focal points with which 0.60 µm rectangular resist patterns could be obtained were examined. The maximum difference (µm) in such focal points was regarded as the focal depth range.

(5) Shape-Profiling Ability

On each sample, a 0.8 µm resist pattern was formed and observed with a SEM photograph. The samples with which rectangular-shaped resist patterns could be obtained were evaluated as grade "A", the samples which resulted slightly trapezoid-shaped resist patterns were evaluated as grade "B", and the samples which resulted in trapezoid-shaped resist patterns were evaluated as grade "C".

(6) Generation of Developer Residue

On each sample, a 0.8 µm resist pattern was formed and observed with a SEM photograph. The samples which did not generate developer residue were evaluated as "good", and the samples which generated developer residue were evaluated as "bad".

(7) Film Fixation Ratio

On each sample, the film fixation ratio was defined as ratio of the thickness in the unexposed portion before development against the thickness in the same portion after development.

Examples 1 to 5

An alkali-soluble resin having a weight average molecular weight of 5600 was obtained by subjecting a 55:45 (mole ratio) mixture of m-cresol and p-cresol to an ordinary condensation reaction with formalin in the presence of an oxalic acid catalyst. The fraction containing the lower molecule components was removed from the above-obtained alkali-soluble resin to yield an alkali-soluble resin having a weight average molecular weight of 7500. In 300 parts by weight of each mixed solvent shown in Table 1, 100 parts by weight of the above-prepared alkali-soluble resin and 30 parts by weight of a quinone diazide-containing compound were dissolved, wherein the quinone diazide-containing compound was an esterified compound prepared from bis (3-cyclohexyl-4-hydroxy-6-methylphenyl)-3,4-dihydroxyphenylmethane and naphthoquinone-1,2-diazide-5-sulfonyl chloride in the mole ratio of 1:2. Each of the resulting solutions was then filtrated with a membrane filter having a pore size of 0.2 m to obtain a positive photoresist coating solution.

Each of the above-prepared positive photoresist coating solutions was evaluated according to the above-described items (1) to (7). The results are shown in Table 1.

TABLE 1

| Ex. | Comp. of Mixed Solvent (weight ratio) | Coating Ability | Sensitivity (ms) | Thermostability (°C.) | Focal Depth Range (μm) |
| --- | --- | --- | --- | --- | --- |
| 1 | PGP:HP (1:9) | good | 230 | 135 | 2.4 |
| 2 | PGP:HP (2:8) | good | 220 | 135 | 2.4 |
| 3 | PGP:HP (4:6) | good | 235 | 135 | 2.6 |
| 4 | PGP:HP (5:5) | good | 220 | 135 | 2.4 |
| 5 | PGP:HP (6:4) | good | 210 | 135 | 2.3 |

| Ex. | Comp. of Mixed Solvent (weight ratio) | Profiling | Developer Residue | Film Fix. Ratio (%) |
| --- | --- | --- | --- | --- |
| 1 | PGP:HP (1:9) | B | good | 98 |
| 2 | PGP:HP (2:8) | A | good | 99 |
| 3 | PGP:HP (4:6) | A | good | 99 |
| 4 | PGP:HP (5:5) | A | good | 99 |
| 5 | PGP:HP (6:4) | B | good | 99 |

Comparative Examples 1 to 7

Positive photoresist coating solutions were prepared similar to the process in Examples 1 to 5 except that the mixed solvents shown in Table 2 were used. Each of the positive photoresist coating solutions thus prepared was evaluated according to the above-described items (1) to (7). The results are shown in Table 2.

TABLE 2

| Com Ex. | Comp. of Mixed Solvent (weight ratio) | Coating Ability | Sensitivity (ms) | Thermostability (°C.) | Focal Depth Range (μm) |
| --- | --- | --- | --- | --- | --- |
| 1 | PGMEA:HP (2:8) | good | 225 | 125 | 1.6 |
| 2 | PGME:HP (3:7) | bad | 240 | 130 | 1.8 |
| 3 | EL:HP (4:6) | good | 210 | 125 | 2.1 |
| 4 | γ—Bu:HP (1:9) | good | 230 | 130 | 2.1 |
| 5 | BA:HP (2:8) | bad | 230 | 130 | 2.0 |
| 6 | ECA:HP (5:5) | good | 210 | 130 | 1.9 |
| 7 | EEP:HP (6:4) | bad | 185 | 125 | 1.8 |

| Com Ex. | Comp. of Mixed Solvent (weight ratio) | Profiling | Developer Residue | Film Fix. Ratio (%) |
| --- | --- | --- | --- | --- |
| 1 | PGMEA:HP (2:8) | C | bad | 96 |
| 2 | PGME:HP (3:7) | C | bad | 95 |
| 3 | EL:HP (4:6) | B | bad | 96 |
| 4 | γ—Bu:HP (1:9) | B | bad | 92 |
| 5 | BA:HP (2:8) | B | bad | 94 |
| 6 | ECA:HP (5:5) | B | bad | 93 |
| 7 | EEP:HP (6:4) | C | bad | 93 |

Notes)
PGP: propylene glycol monopropyl ether
HP: 2-heptanone
PGMEA: propylene glycol monomethyl ether acetate
PGME: propylene glycol monomethyl ether
EL: ethyl lactate
γ-Bu: γ-butyrolactone
BA: butyl acetate
ECA: ethylene glycol monoethyl ether acetate
EEP: ethyl 3-ethoxypropionate As is obvious from Tables 1 and 2 above, the positive photoresist coating solutions according to the present invention are excellent in coating ability, sensitivity, thermostability, focal depth range, and shape-profiling ability, and in addition, they do not generate developer residue while they exhibit high film fixation ratios.

As described above, the positive photoresist coating solution of the present invention exhibits excellent coating ability, sensitivity, thermostability, focal depth range, shape-profiling ability, and etc. The coating solution of the present invention has excellent coating ability especially for silicon wafers and glass substrates having large diameters, do not generate developer residue, and exhibits a high film fixation ratio. In light of possessing the above-mentioned desirable characteristics, the positive photoresist coating solution of the present invention can cope with advancing fineness in resist patterns and increases in the size of silicon wafers and glass substrates.

While the invention has been described in detail and with reference to specific embodiments thereof, it will be apparent to one of ordinary skill in the art that various changes and modifications can be made therein without departing from the spirit and scope thereof.

What is claimed is:

1. A positive photoresist coating solution comprising (a) an alkali-soluble resin, (b) a quinone diazide group-containing compound, and (c) an organic solvent in an amount sufficient for dissolving said (a) and (b) components, wherein said organic solvent contains (i) propylene glycol monopropyl ether and (ii) 2-heptanone.

2. The positive photoresist coating solution according to claim 1, wherein 5 to 100% by weight of said (b) quinone diazide group-containing compound relative to said (a) alkali-soluble resin is used.

3. The positive photoresist coating solution according to claim 1 or 2, wherein said organic solvent contains (i) 10 to 60% by weight of propylene glycol monopropyl ether and (ii) 40 to 90% by weight of 2-heptanone.

4. The positive photoresist coating solution according to claim 1 or 2, wherein said alkali-soluble resin is selected from a condensation product of a phenol compound with an aldehyde compound, or a phenol compound with a ketone compound; and polyhydroxystyrene, and derivatives thereof.

5. The positive photoresist coating solution according to claim 4, wherein said condensation product has a weight average molecular weight of 2,000 to 20,000.

6. The positive photoresist coating solution according to claim 4, wherein said (a) alkali-soluble resin is a cresol-novolak resin.

7. The positive photoresist coating solution according to claim 1 or 2, wherein said quinone diazide group-containing compound is a completely or partially esterified compound of a polyhydroxy compound with naphthoquinone-1,2-diazide-5-sulfonic acid or naphthoquinone-1,2-diazide-4-sulfonic acid.

8. The positive photoresist coating solution according to claim 7, wherein said quinone diazide group-containing compound is a completely or partially esterified compound of a polyhydroxy compound having a molecular weight of 600 or less with naphthoquinone-1,2-diazide-5-sulfonic acid or naphthoquinone-1,2-diazide-4-sulfonic acid.

9. The positive photoresist coating solution according to claim 1 or 2, wherein a phenol compound having a molecular weight of 600 or less is further added to the solution.

* * * * *

UNITED STATES PATENT AND TRADEMARK OFFICE
CERTIFICATE OF CORRECTION

PATENT NO. : 5,702,862
DATED : December 30, 1997
INVENTOR(S) : OHNO, et al

It is certified that error appears in the above-identified patent and that said Letters Patent is hereby corrected as shown below:

In column 8, at line 46, before "(b)" insert --said--;

at line 56, delete "of" and insert --or--; and at line 57, delete "polyhydroxy stylene" and insert --polyhydroxystyrene--.

Signed and Sealed this

Thirteenth Day of October 1998

Attest:

BRUCE LEHMAN

Attesting Officer

Commissioner of Patents and Trademarks